(12) United States Patent
Grabher et al.

(10) Patent No.: US 7,067,241 B2
(45) Date of Patent: Jun. 27, 2006

(54) METHOD FOR PRODUCING A UNIT HAVING A THREE-DIMENSIONAL SURFACE PATTERNING, AND USE OF THIS METHOD

(75) Inventors: Patrick Grabher, Bregenz (AT); Claus Heine-Kempkens, Chur (CH); Roger Bischofberger, Buchs (CH)

(73) Assignee: Unaxis Balzers Aktiengesellschaft, Balzers (LI)

( * ) Notice: Subject to any disclaimer, the term of this patent is extended or adjusted under 35 U.S.C. 154(b) by 109 days.

(21) Appl. No.: 10/430,887

(22) Filed: May 5, 2003

(65) Prior Publication Data

US 2004/0048171 A1 Mar. 11, 2004

Related U.S. Application Data

(60) Provisional application No. 60/379,102, filed on May 8, 2002.

(51) Int. Cl.
*G03F 7/00* (2006.01)
*G03F 7/40* (2006.01)

(52) U.S. Cl. ........................ 430/328; 430/324
(58) Field of Classification Search ............ 430/7, 430/320, 321, 322, 324, 328, 329, 330
See application file for complete search history.

(56) References Cited

U.S. PATENT DOCUMENTS

| | | | |
|---|---|---|---|
| 4,718,974 A * | 1/1988 | Minaee | 438/708 |
| 4,778,536 A * | 10/1988 | Grebinski | 134/36 |
| 5,246,803 A | 9/1993 | Hanrahan et al. | 430/7 |
| 5,360,698 A | 11/1994 | Hanrahan | 430/324 |
| 5,510,215 A | 4/1996 | Prince et al. | 430/7 |
| 6,150,070 A * | 11/2000 | Minter et al. | 430/296 |
| 6,753,129 B1 * | 6/2004 | Livesay et al. | 430/296 |

FOREIGN PATENT DOCUMENTS

| | | |
|---|---|---|
| DE | 44 10 258 | 10/1994 |
| EP | 224 843 * | 11/1986 |
| WO | WO 98/20383 | 5/1998 |
| WO | PCT/CH 03/00296 | 5/2003 |

* cited by examiner

*Primary Examiner*—Nicole Barreca
(74) *Attorney, Agent, or Firm*—Needle & Rosenberg, P.C.

(57) ABSTRACT

A method for producing a unit having a three-dimensional surface patterning on a base layer. A photoresist is applied to a base layer and subjected to a masked exposure matched to a predetermined final surface patterning. Parts of the photoresist layer are removed by developing to provide an initial surface patterning, including photoresist sacrificial subregions. A coating which covers the initial surface patterning is then applied. Energy is then applied to the initial surface patterning to destabilize the sacrificial layer regions. The initial surface patterning is acted on by a high-pressure liquid jet at a predetermined treatment temperature such that at least part of the coating which covers the sacrificial layer regions are mechanically removed or at least broken open to produce the final surface patterning. The liquid has a negligible chemical reaction rate and/or physical dissolution rate with respect to materials of the unit and/or organic fluid-sealing means.

34 Claims, 2 Drawing Sheets

METHOD FOR PRODUCING A UNIT HAVING A THREE-DIMENSIONAL SURFACE PATTERNING, AND USE OF THIS METHOD

This application claims priority to U.S. Provisional Application No. 60/379,102, filed May 8, 2002, and which is herein incorporated by reference in its entirety under 35 U.S.C. § 120.

TECHNICAL FIELD

The invention relates to a method ("lift-off method") for producing a unit having a three-dimensional surface patterning in accordance with Patent claim 1 and to a use of this method in accordance with Patent claim 13.

OBJECT OF THE INVENTION

The object of the present invention is to provide a method making it possible to produce a three-dimensional surface patterning without expensive solvents which are difficult to handle having to be used. The surface structures of the pattern are preferably in the micrometer and sub-micrometer range. However, the method can also be used for less fine patterning.

SOLUTION

The object is achieved by the features described in Patent claim 1.

According to the invention, to produce a unit having a three-dimensional surface patterning on a base layer, in a first method step a photoresist is applied in order to produce a photoresist layer. In a subsequent second method step, the photoresist layer is subjected to masked exposure which is matched to a predetermined surface patterning. In a third method step, parts of the photoresist layer are removed by developing, so that an initial surface patterning which includes sacrificial layer regions is obtained. The material of the sacrificial layer regions is the remaining photoresist. In a fourth method step, a coating which covers the initial surface patterning which has now been obtained is applied The properties of this initial surface patterning substantially depend on the requirements when the unit is in use. The coating may be a single layer or alternating layers. The application can be effected by spraying, by means of a CVD process or by means of a PVD process. This coating will preferably be sputtered on. The fourth method step is followed by a fifth method step by energy being applied to the unit in order to destabilize the remaining sacrificial layer regions which have been covered by the coating. The energy can be applied from the front of the unit and from the back of the unit or from both sides. The energy will preferably be applied from the back of the unit. The back is generally more accessible to the energy application methods listed below than the front of the unit. This is because the front of the unit is being treated on an ongoing basis in order to produce the patterning. In a sixth method step, a high-pressure liquid jet is then applied to the front side. Since the sacrificial layer regions below the coating have been destabilized by the application of energy, the high-pressure liquid jet removes these sacrificial layer regions together with the coating above them by mechanical means and/or breaks open at least the coating above the sacrificial layer regions. At the selected treatment temperature, a chemical and/or physical dissolution rate by the liquid of the high-pressure liquid jet is negligible, i.e. is below a measurement limit. The materials of the unit and the fluid-sealing means of the apparatus used for the method are therefore not attacked to any detectable degree while they are being acted on by the high-pressure liquid jet. Fluid-sealing means are understood as meaning materials which are used, for example in fluid lines, to form a seal in an apparatus for carrying out the method according to the invention. Examples of fluid-sealing means are O-rings, sealing disks, etc.

The application of energy has made the sacrificial layer regions "crumbly." Therefore, the high-pressure liquid jet penetrates into these regions, tearing open the coating above the sacrificial layer regions. This "breaking open" or "penetration" may take place in such a manner that a sacrificial layer region is in each case completely removed (blasted off) as a result. However, the region may also in each case be only partially broken open. However, this breaking-open results in significantly larger three-dimensional defects than, for example, it is possible to achieve within an economically acceptable time by the application of sound in an ultrasound bath.

The sacrificial layer regions which are covered by the coating are removed by the destabilization of the sacrificial layer regions, while the regions of the coating which do not have sacrificial layer regions, i.e. just have the base layer coated with the coating, remain in place. The heights of the initial surface patterning according to this method are the depths of the final surface patterning.

It was known to remove sacrificial layer regions by flushing with a liquid causing swelling and chemical and/or physical dissolution. By contrast, the invention dispenses with the need for chemical and/or physical dissolution. This is because the invention uses liquids whose chemical and physical dissolution rates, at a treatment temperature used in the method, with respect to materials of the unit and fluid-sealing means used in the apparatus used to carry out the method, during their application, are below the measurement limit. Fluid-sealing means, such as sealing rings and disks, generally consist of organic material. Also, the invention does not use any materials which react with the ambient air. Therefore, inter alia, there is no need to take any special safety precautions (avoidance of risk of explosion, difficulty of disposal, carcinogenic substances, etc.), as required with the known solvents acetone, alcohol, etc. The mechanical structure can also be made simpler and less expensive, since the liquid which is to be used for the high-pressure liquid jet does not attack either the material of an apparatus used for the method or the sealing means of this apparatus. Therefore, inexpensive mass-produced articles comprising seals, O-rings, sealing washers, etc., as are used, for example, in the field of domestic sanitary installations, can be used as sealing means.

By way of explanation, it should be mentioned that according to "Römpp", 9 th Edition, page 2539, a distinction is drawn between physical dissolution and chemical dissolution. If, for example, cooking salt or sugar is dissolved in water, after the solution has been evaporated or dried, the entire quantity of the substance which was originally dissolved is recovered in unchanged form. Since there has been no significant change to the cooking salt or sugar substance during this dissolution operation, this is described as physical dissolution.

By contrast, chemical dissolution is linked to a chemical reaction between the solid substance and the solvent. When the solvent is removed by evaporation, what remains is a new substance. For example, if hydrochloric acid is poured onto iron, the iron dissolves, with gas being evolved and with the solution being colored green. In this case, it is not the iron which is dissolved but rather the iron(II) chloride which has formed as a result of a chemical process.

A high-pressure liquid jet is understood to mean a jet in which the pressure before it leaves a nozzle which shapes the jet is a few tens of bar. The pressure depends on the structure, the layer thicknesses, the surface dimensions, the material or materials and the nature of coverage of the pattern structures which are to be removed. To generate the desired surface pattern structures, the pressure of the high-pressure liquid jet is approx. 100 bar to 180 bar.

The properties of the photoresist layer change as a result of irradiation with visible radiation or radiation in the near ultraviolet region. The photographic layer may consist of a photosensitive polymer material. There are positive and negative photosensitive materials and what are known as image reversal resists. The developing of the photographic layer after the exposure depends on the layer material used, the layer thickness and the exposure intensity.

The photographic layer may, for example, consist of an image reversal resist with a layer thickness of 1.5 µm to 10 µm. The layer thickness selected and the material used for this layer are dependent on the use of the patterned coating which is to be produced. For example, if a patterned, optical color filter is being produced, layer thicknesses of between 3 µm and 5 µm will be used and the layer will be developed using aqueous sodium hydroxide solution NaOH with a concentration of greater 25 than 0.8%. In the case of an image reversal resist, it is preferable to use an approximately 1.2% strength aqueous sodium hydroxide solution.

The image reversal resist which is preferably used here combines the advantages of a positive resist with those of a negative resist. The image reversal resist is in this case exposed twice, the second exposure taking place in the ultraviolet region with an irradiation dose of greater than 300 mJ/cm$^2$. Between the two exposure steps, heating preferably takes place, i.e. "baking" at a temperature of between 110° C. and 130° C. The parameters used for the heating are dependent on the resist material used; in this case, by way of example, a photoresist designated as Ti35E produced by Micro Chemicals is used. It is preferable to use the highest possible temperature at which the photoresist does not start to flow, since the baking then takes less time. Therefore, in the example described here, a temperature of 130° C. is typically used.

The remaining sacrificial layer regions which are covered with the coating are broken open by the high-pressure liquid jet and are often not completely removed. In this case, to completely remove remaining, possibly partially covered sacrificial layer regions, in a seventh method step, a solvent, typically aqueous sodium hydroxide solution NaOH with a concentration of between 1% and 20%, preferably between 9.5% and 10.5%, in particular of 10%, is then preferably applied using a further feed system which is separate from the high-pressure liquid jet. The solvent will preferably be applied immediately after the high-pressure liquid jet. The use of separate feed systems enables the pipeline material and seals of the feed system for the solvent to be specifically designed for the properties of the solvent. Unlike the high-pressure liquid jet, the solvent is applied at a low pressure "splash jet"). In terms of pressure, therefore, there are no particular demands imposed on the system of lines for the solvent.

The destabilization of the remaining sacrificial layer regions covered by the upper layer in the fifth method step is effected by applying energy to the entire coating. Depending on the layer materials used, in particular the material used for the coating which covers everything, the following methods may be employed:

UV flood exposure, for example at 500 to 1500 mJ/cm$^2$ for 4 to 10 minutes;

boiling (typically 1 to 2 hours) in a liquid which does not attack it (e.g. water);

superheated vapor (e.g. steam at 127° C. at 2.5 bar) with a negligible chemical reaction rate;

heating microwave radiation at typically 100 W with a duration of 5 minutes.

The coating on the developed photoresist layer is selected according to the particular use. In this case, for example for optical applications, the use will be for a patterned dielectric film (e.g. a color filter). The coating may be formed as an alternating layer system, for example comprising a sequence of layers with a high optical refractive index and a low optical refractive index, comprising at least two different oxides or oxynitrides from groups IVA, IVB, VB of the periodic system. The material with a high refractive index used may, for example, be TiO2, Ta2Os, Nb2Os, HfO$_2$, ZrO$_2$, SiOxNy, etc., and the material with a low refractive index used may, for example, be SiO$_2$, Al2O$_3$, SiOxN$_y$, etc. In this case, the upper layer will be produced with a thickness of between 0.5 µm and 5 µm, preferably between 1 µm and 2 µm. The application or sputtering of this alternating layer sequence in the fourth method step will be carried out in particular with the unit at a temperature of below 120° C. If other materials are used, other temperatures will also be used. A method for producing a coating of this type is described, for example, in DE-A 44 10 258.

The exposure of the photoresist can be effected by imaging a chrome mask onto the upper layer. The chrome mask will preferably be effected using a mercury vapor lamp (emission line at 365 nm; intensity 160 mJ/cm$^2$). However, it is also possible to use a laser beam which is moved over the upper layer according to the desired pattern. If a laser beam is used, its focal point can be set in such a manner that it is above, on or inside the photoresist layer. If a focal point with a short focal length is located, for example, on the photoresist layer, the laser radiation diverges to a considerable extent in the photoresist. In this case, relatively low-lying regions of the photoresist are exposed to a lesser extent than regions in the immediate vicinity of the surface. This diverging exposure helps to produce overhanging side walls in the pattern which is to be produced. Overhanging walls lead to a configuration which, together with the destabilization mentioned above, makes it easier for the remaining sacrificial layer regions covered by the upper layer to be broken open or removed using the high-pressure liquid jet.

Virtually all liquids whose chemical and physical dissolution rate at standard temperature with respect to materials of the unit and with respect to fluid-sealing means during the application is below the measurement limit can be used as liquids for the high-pressure liquid jet. However, if DI water (deionized, filtered water) at a pressure of between 100 bar and 180 bar is used as liquid for the high-pressure liquid jet, the patterned front side is simultaneously cleaned and is therefore ready for a subsequent method step, e.g. for a lithography process. This results in an additional increase in efficiency over the known methods.

Further advantageous embodiments and combinations of features of the invention will emerge from the 30 following detailed description and from all the patent claims.

BRIEF DESCRIPTION OF THE DRAWINGS

In the drawings used to explain the exemplary embodiments.

WAYS OF CARRYING OUT THE INVENTION

Figure 1:
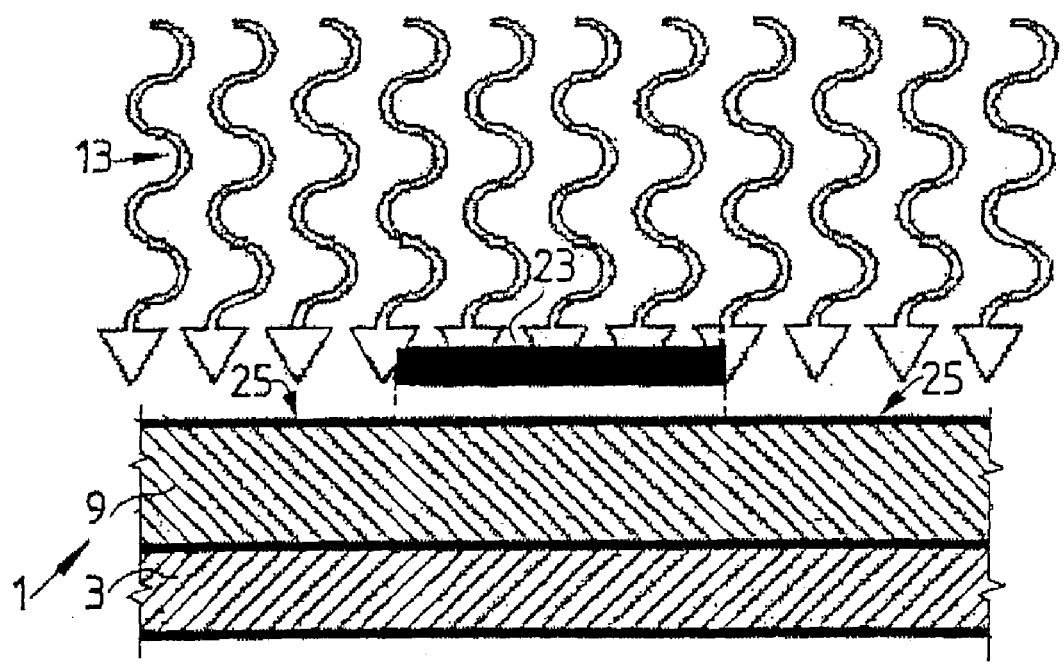
FIG. 1 shows a cross section through a unit with a base layer which is covered with a photoresist layer which is exposed in mask form.

FIG. 1 shows a unit 1 having a base layer (3), to which a photoresist layer 9 has been applied. The photoresist layer 9 has a thickness of 3 μm to 5 μm.

The choice of photoresist to be used to produce the resist layer 9 is very important. A photoresist having the properties of a negative resist leads to side walls with a negative inclination, i.e. to overhanging walls, during the surface patterning. This results from the fact that the intensity of the light (radiation) used for the exposure is absorbed to an increasing extent as it penetrates more deeply into the photoresist. These overhanging walls are desirable in the "lift-off method", since the coating then has discontinuities at the edges of the pattern structure, making it easier to remove the developed photoresist layer regions (sacrificial layer regions) which have been provided with a coating as described below. This argument speaks in favor of using a negative resist.

However, a drawback of using a negative resist is its tendency to draw threads when it is being spun on, which may lead to a poor resist homogeneity in the layer applied. By contrast, a positive resist is easy to spin on but, as explained above, does not lead to overhanging side walls. If there are no overhanging side walls in the pattern, the coating is continuous at the edges of the pattern structures and the subsequent "lift-off" step is made more difficult.

By way of example, a photoresist designated Ti35E produced by Micro Chemicals is used. This is what is known as an image reversal resist (IRR). As tests have determined, this photoresist has the particular property that, after it has been exposed and then heated in a locally resolved manner according to the desired surface patterning, it can be exposed again. This second exposure, which is generally carried out as homogenous exposure with a strong intensity (flood exposure), causes the photoresist to acquire the characteristics of a negative resist for the subsequent developing, with the result that overhanging side walls are obtained in the pattern.

The masked exposure 13 of the photoresist layer 9, which is matched to a predetermined final surface patterning, in the second method step, as diagrammatically indicated in FIG. 1, takes place using a photomask 23. For this purpose, by way of example, it is possible to use what is known as a gray scale mask. However, it is also possible to use phase shift masks in combination with a suitable light source.

In the example described here, the photomask used is a chrome mask 23. The photoresist 9 lying on the base layer 3 of the unit 1 is irradiated by the radiation 13 from a mercury vapor lamp. The radiation 13 has an intensive emission line at 365 nm. The intensity is approximately 160 mJ/cm$^2$.

The exposure time required is generally dependent on the desired pattern, on the radiation source (light source) used and possibly also on the photomask used.

After the "patterning" exposure (first exposure), the unit 1 with the exposed photoresist 9 on the layer 3 is "baked" at 110° C. to 130° C. This is followed by further exposure using the radiation from a mercury vapor lamp (substantially at a radiation wavelength of 365 nm) and an intensity of approximately 400 mJ/cm$^2$. The photoresist Ti35E used here acquires the properties of a negative resist as a result of this second exposure (irradiation).

This second exposure is followed by a developing step as the third method step. For this purpose, the action of a 1.2% strength NaOH solution is used. The regions of the photoresist layer 9 which are exposed during the first exposure are retained during this action and therefore form an initial surface patterning. The concentration of the solution of 1.2% which is given here is merely a guideline and can be matched to the prevailing conditions, such as for example the photoresist thickness and the exposure intensity.

Figure 2:
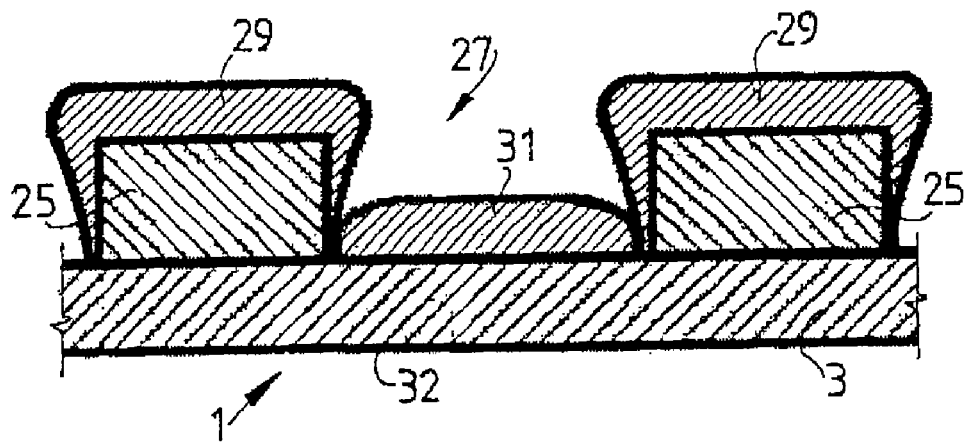
FIG. 2 shows a cross section through the unit illustrated in FIG. 1 after development of the photoresist layer with a subsequent coating.

In the following fourth method step, the result of which is shown in FIG. 2, the initial surface patterning with remaining regions 25 and the regions 27 which have been removed by the developing are provided with a coating. The coating areas on the regions are denoted by 29 and the coating areas in the regions 27 are denoted by 31, even though these areas are one and the same material. By way of example, in this case an alternating layer system with a thickness of approx. 1 pm to 2 μm is applied by sputtering. The materials to be used have already been alluded to in the introduction. Sputtering is well suited compared to other possible coating methods, since it is possible to maintain low operating temperatures, in this case, for example, of below 120° C., at the unit 1 yet the coating nevertheless leads to a stable, in particular temperature-stable, alternating layer system.

After the coating operation, the base layer 3 is covered by regions comprising a photoresist subregion 25 covered with the coating 29 and base layer regions 3 covered only with the coating 31, the composition of which is identical to that of the coating 29. The surface profile substantially corresponds to the initial surface patterning.

This coating operation is followed by the application of energy to the unit 1 from the rear side 32. The energy is applied by means of UV light irradiation, known as flood exposure at, as has already been mentioned above, 500 mJ to 1500 mJ/cm$^2$ for 4 to 10 minutes. This treatment leads to at least partial destabilization of the layer system comprising the photoresist subregion 25 and the coating 29 above it.

Figure 3:
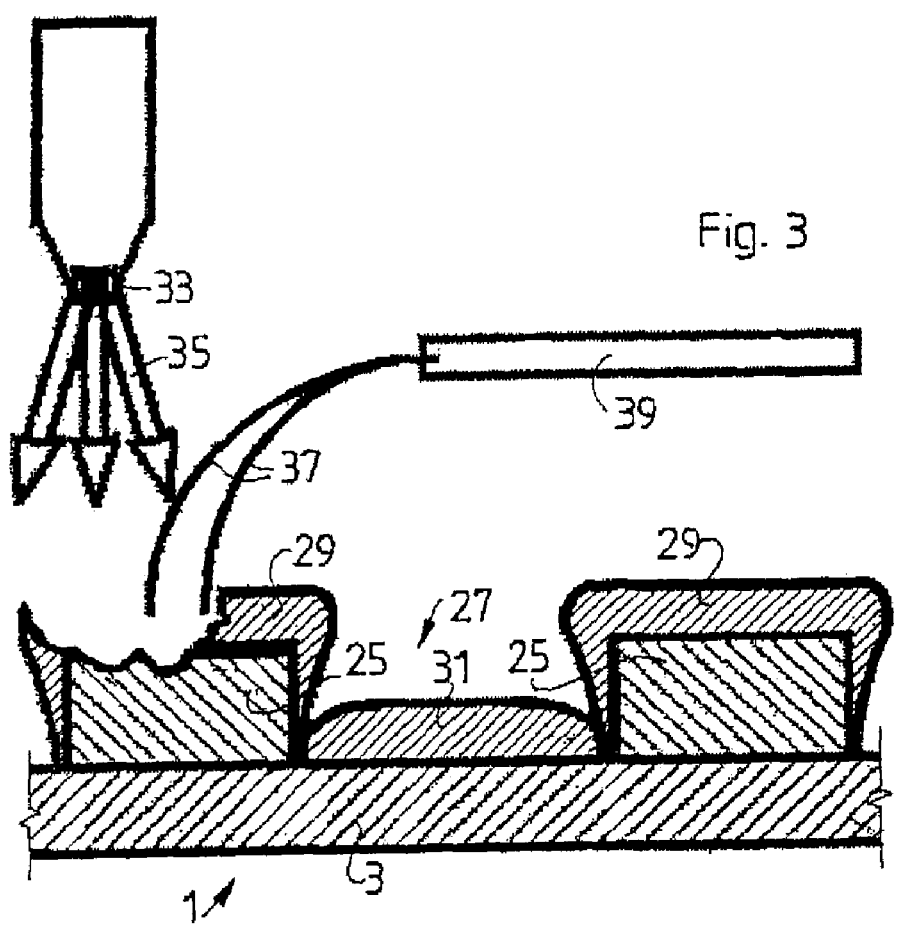
FIG. 3 shows a sketch illustrating the inventive removal of the sacrificial layer regions 10 (developed photoresist layer regions) which have been destabilized by application of energy and are covered with a coating.

In a sixth method step, known as the "lift-off process", the photographic layer subregions 25 which bear the coating 29 are now to be removed. To remove these regions, which have already been destabilized by the application of energy, the initial surface patterning is acted on, as indicated in FIG. 3, by a high-pressure water jet 35 emerging from a high-pressure nozzle 33. Surprisingly, this action now makes it possible to remove the coating 29 from the photoresist subregion 25 without the coating 31 in the regions which are free of photoresist being attacked. Therefore, the photoresist subregions 25 have acted as sacrificial layer regions. The high-pressure nozzle 33 is a commercially available nozzle; a pressure in the range from 100 bar to 180 bar is used. If the pressure is below 100 bar, the removal effect is too weak, and if the pressure is above 180 bar, the temperature may be too high.

A wide range of liquids can be used for the high-pressure liquid jet. On account of the advantageous properties of DI water (deionized, filtered water), however, this is preferably the liquid used, since it is available in a high quality and at a low cost and does not leave any residues when it is used. Moreover, it is a technically simple matter to maintain operation of a high-pressure nozzle with DI water, since the mechanical components of an apparatus for carrying out the method are not attacked or are only attacked to a slight extent. It should additionally be pointed out that the use of DI water does not present any environmental problems.

After the high-pressure liquid jet 35 has been applied, it is possible for a simple solvent 37, such as for example NaOH solution, to be applied to the initial surface patterning being attacked, as indicated in FIG. 3, in order to remove the remaining parts of the photoresist subregions 25 and of the coating 29. After this removal, what remains is the final surface patterning. In FIG. 3, the solvent 37 is supplied through a feed system 39 which is separate from the high-pressure liquid jet 33; however, it may also be supplied together with the high-pressure liquid jet 33. The solvent 37 may be supplied at the same time as the high-pressure liquid or immediately after it. The high-pressure liquid jet may also comprise a liquid which is a solvent for the photoresist but does not significantly attack the unit 1 [unit in accordance with method step 2 (FIG. 2: developed photoresist layer with subsequent, for example, alternating layer 5 coating 29/31)] and the patterning apparatus.

Figure 4:
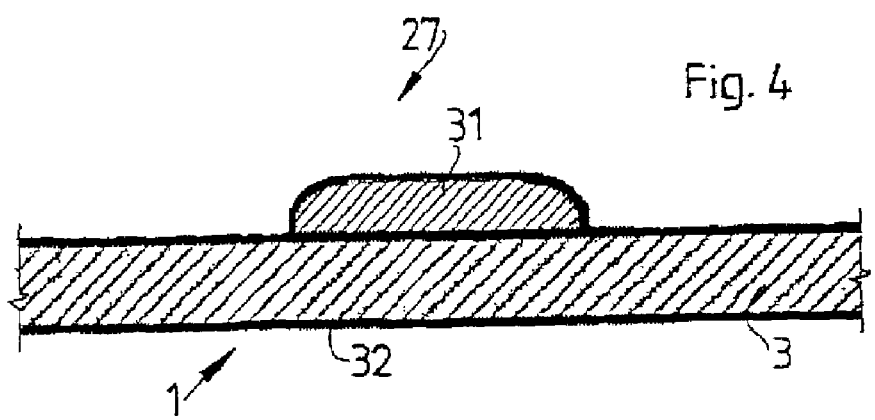
FIG. 4 shows a cross section through the unit illustrated in FIG. 1 after all the method steps have been carried out, with a final surface patterning which has now been produced; for the sake of simplicity, only one of a large number of possible raised regions of the pattern is illustrated In principle, throughout the figures identical parts and components are provided with identical reference symbols.

In a final method step—it is possible that some side walls of the surface pattern structure may have remained in place—the surface pattern, i.e. the final surface pattern, can be sprayed down once again by the high-pressure water jet 33. This cleans off any undesirable coating residues which may remain. As can be seen from FIG. 4, what remains is a patterned unit (having a final surface patterning with the heights and depths having been swapped over compared to the initial surface patterning). The use of DI water at the same time cleans the unit, so that it is ready for a subsequent process step, which may quite possibly be a further lithography process. After the cleaning, the units should be kept wet and should only be dried at a later stage, in order to avoid the formation of drying spots.

The maximum feature size is only limited by the size of the unit and of the mask used for exposure. Relatively large feature sizes in the micrometer range are produced by means of gray scale masks and/or chrome masks. Interference effects, for example from phase shift masks, are used for smaller features. For feature sizes of as little as less than 10 nm, it is possible to use electron beam writing.

As an alternative to irradiating the photoresist with a mercury vapor lamp using a chrome mask 23 as a function of the required surface patterning, it is also possible to use a laser beam which moves over the photoresist layer according to the predetermined patterning. It is then possible to dispense with the chrome mask 23. The laser beam can also be used to achieve the overhanging walls of the pattern mentioned above. For this purpose, a suitable intensity profile can be imposed on the laser beam over its cross section. The intensity profile can be imposed over the beam cross section by means of suitable partially transparent apertures, a selected mode structure of the laser beam or a selected focusing depth of the focusing optics.

For example, if a laser beam is focused onto a region above the photoresist with a low depth of focus, this laser beam will spread out in a highly divergent manner in the photoresist. As a result, relatively low-lying regions are exposed less strongly tan regions which lie closer to the top side of the photoresist; overhanging side walls of the pattern structure are then obtained after the developing step.

As an alternative to a laser beam, the predetermined pattern can also be written in using an electron beam. It is also possible to use what is known as two-beam interference to expose the photoresist layer.

As an alternative to the application of energy for destabilization being effected using UV light from the rear side 32 of the unit 1, irradiation may, of course, also take place from the front side. The advantages of irradiation from the rear side and also of other ways of applying energy have already been dealt with in the introduction.

If the unit is "boiled" or heated in steam in order for energy to be applied, it has proven advantageous with a view to amplifying the destabilization to perform a subsequent quenching operation using cold water. In this case, it has been found that the expansion effect of the image reversal resist produced by Micro Chemicals is higher than that of a standard negative resist (e.g. Azlof2035 produced by Clariant). The selected photoresist produced by Micro Chemical is therefore more effective.

The abovementioned application of a simple solvent (NaOH) to remove any remaining photoresist subregions with any partial coating (parts of 29) may, in a particularly advantageous variant, take place as part of the "breaking-open" high-pressure liquid jet 33 or immediately after this jet has been switched off. Since the photoresist subregions are now at least partially uncovered, the photoresist is quickly dissolved when it comes into contact with the NaOH solution.

Unlike in known methods, in this case, when a high-pressure liquid jet is used in the "lift-off method", there is no need for an aggressive solvent, but rather simply a weak solvent or even just water is used. Moreover, it is possible to use a different liquid for the mechanical breaking-open from the liquid used to remove or dissolve the "sacrificial layer" formed by the photographic layer subregions. However, the mechanical breaking-open, as described here, can only be achieved with acceptable outlay if destabilization has previously been performed.

The invention claimed is:

1. Method ("lift-off method") for producing a unit having a three-dimensional final surface patterning on a base layer, in which method, in a first method step, a photoresist is applied to the base layer in order to produce a photoresist layer, in a second method step, a masked exposure, which is matched to a determined final surface patterning, of the photorosist layer is performed, in a third method step, parts of the photoresist layer are removed by developing, so that an initial surface patterning which includes photoresist subregions as sacrificial layer regions is obtained, in a fourth method step, a coating which covers the initial surface patterning which has now been obtained is applied, in a fifth method step, energy is applied to the initial surface patterning in order to destabilize the sacrificial layer regions, in a sixth method, step the initial surface patterning is acted on by a high-pressure liquid jet at a predetermined treatment temperature, with at least parts of the coating which covers the sacrificial layer regions being mechanically removed or at least broken open in order to produce the final surface patterning, where in the sixth method step, during said treatment said liquid of the high-pressure liquid jet at said predetermined treatment temperature having only a negligible chemical reaction rate and/or a negligible physical dissolution rate with respect to materials of the unit below a measurement limit.

2. Method according to claim 1 whereas said unit being arranged during said producing in a device having organic fluid-sealing means, where in the sixth method step, during said treatment said liquid of the high-pressure liquid jet at said predetermined treatment temperature having only a negligible chemical reaction rate and/or a physical dissolution rate with respect to said organic fluid-sealing means below a measurement limit.

3. Method according to claim 1, whereas, in said fourth method step, said coating which covers the initial surface patterning which has been obtained is applied as an alternating layer.

4. Method according to claim 1, whereas, in said fourth method step, said coating which covers the initial surface patterning which has been obtained is applied by sputtering.

5. Method according to claim 1, characterized in that, in a seventh method step, a solvent is applied in order to remove material from accessible parts of the sacrificial layer regions.

6. Method according to claim 5, whereas for said solvent aqueous sodium hydroxide solution NaOH with volume concentration between 1% and 20% is used.

7. Method according to claim 5, whereas for said solvent aqueous sodium hydroxide solution NaOH with a volume concentration between 9.5% and 10.5% is used.

8. Method according to claim 5, whereas for said solvent aqueous sodium hydroxide solution NaOH with a volume concentration of 10% is used.

9. Method according to claim 6, characterized in that the solvent is applied at the same time as the high-pressure liquid jet.

10. Method according to claim 6, characterized in that the solvent is applied immediately after the high-pressure liquid jet.

11. Method according to claim 6, wherein the solvent is applied immediately after the high-pressure liquid jet by means of a feed system which is separate the high-pressure liquid jet.

12. Method according to claim 1, characterized in that the destabilizing energy applied in the fifth method step is UV flood exposure.

13. Method according to claim 1, characterized in that superheated vapor with a negligible chemical reaction rate is used for the destabilizing application of energy in the fifth method step.

14. Method according to claim 13, wherein for said superheated vapor a water steam is used.

15. Method according to claim 13, wherein said superheated vapor is used with application of pressure.

16. Method according to claim 1, characterized in that for the destabilizing application of energy in the fifth method step the unit is boiled in a liquid which does not attack it.

17. Method according to claim 16, wherein, in the fifth step, the unit is boiled in water.

18. Method according to claim 1, characterized in that heating microwave radiation is used for the destabilizing application of energy in the fifth method step.

19. Method according to claim 1, characterized in that cold quenching takes place after the destabilizing application of energy in the fifth method step.

20. Method according to claim 1, characterized in that the photoresist used is what is known as an image reversal resist, and after the masked exposure, in the second method step, the photoresist layer is heated and is then, in an intermediate step, exposed for a second time.

21. Method according to claim 20, wherein said image reversal resist is used with a layer thickness of 0.1 μm to 10μm.

22. Method according to claim 20, wherein said image reversal resist is used with a layer thickness between 3μm and 5μm.

23. Method according to claim 20, wherein after the masked exposure in the second method step, the photoresist layer is baked at a temperature between 110° C. and 130° C.

24. Method according to claim 20, wherein, in an intermediate step relating to the second method step, said photoresist layer being exposed for a second time homogeneously with a strong exposure in the near ultraviolet region of greater than 300 mJ/cm$^2$.

25. Method according to claim 1, characterized in that the exposure of the photoresist is performed by a light beam, the intensity profile of which is deformed within the photoresist layer in such a manner that it spreads out in a divergent manner in the photoresist by being focused onto the top side of the photoresist layer so that lower-lying regions of the photoresist layer are locally exposed to a lesser extent than regions in the immediate vicinity of the surface.

26. Method according to claim 25, wherein the exposure of the photoresist is performed by a laser beam as light beam.

27. Method according to claim 1, characterized in that the coating, as an alternating layer system, comprises at least one material with a high refractive index and at least one material with a low refractive index, comprising at least two different oxides or oxynitrides from groups IV A, IVB, IVB of the periodic system, and has a thickness of between 0.5μm and 5μm and, during the fourth method step, the temperature of the unit is kept below 120° C.

28. Method according to claim 27, wherein the coating, as an alternating layer system, has a thickness of between 1μm and 2μm.

29. Method according to claim 1, characterized in that the liquid used for the high-pressure liquid jet is DI water (deionized, filtered water), so that the patterned front side is simultaneously cleaned and is therefore ready for a subsequent method step, e.g. for a lithography process.

30. Method according to claim 29, characterized in that the liquid used for the high-pressure liquid jet is DI water (deionized, filtered water) at a pressure of between 100 bar and 180 bar.

31. Method according to claim 29, characterized in that the liquid used for the high-pressure liquid jet is Dl water (deionized, filtered water) at a temperature of greater than 60° C.

32. Use of the method according to claim 1, for producing patterned dielectric films on an optical unit.

33. Use of the method according to claim 32, wherein the use is for producing a patterned optical color filter.

34. Use of the method according to claim 32, wherein the use is for producing a color wheel.

* * * * *